(12) United States Patent
Miura

(10) Patent No.: US 11,031,322 B2
(45) Date of Patent: Jun. 8, 2021

(54) SEMICONDUCTOR DEVICE MOUNTED ON CIRCUIT BOARD OF ELECTRONIC DEVICE

(71) Applicant: ROHM CO., LTD., Kyoto (JP)

(72) Inventor: Yoshikatsu Miura, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 95 days.

(21) Appl. No.: 16/388,021

(22) Filed: Apr. 18, 2019

(65) Prior Publication Data
US 2019/0326204 A1    Oct. 24, 2019

(30) Foreign Application Priority Data
Apr. 24, 2018 (JP) .............................. JP2018-082981

(51) Int. Cl.
*H01L 23/495* (2006.01)
*H01L 23/31* (2006.01)

(52) U.S. Cl.
CPC .... *H01L 23/49555* (2013.01); *H01L 23/3107* (2013.01); *H01L 23/49503* (2013.01); *H01L 23/49562* (2013.01)

(58) Field of Classification Search
CPC .......................... H01L 2224/401–40265; H01L 2224/4005–40095; H01L 2224/404–40499; H01L 23/4955; H01L 23/49562; H01L 23/49503; H01L 2224/0603; H01L 2224/08151–08268; H01L 2224/05541–05548; H01L 2224/055–05559; H01L 2224/0555–05559; H01L 2224/05575–05584; H01L 2224/0801; H01L 2224/08052–0807; H01L 2224/081–08268; H01L 2224/04034
See application file for complete search history.

(56) References Cited

U.S. PATENT DOCUMENTS

2007/0228534 A1* 10/2007 Uno ..................... H01L 23/50
                                                257/678
2011/0102059 A1* 5/2011 Stoisiek ............ H01L 29/7816
                                                327/512

FOREIGN PATENT DOCUMENTS

JP         2006-310609         11/2006

* cited by examiner

*Primary Examiner* — Tucker J Wright
(74) *Attorney, Agent, or Firm* — Hamre, Schumann, Mueller & Larson, P.C.

(57) ABSTRACT

There is provided a semiconductor device, including: a semiconductor element which includes an element main surface and an element rear surface that face opposite sides in a thickness direction and in which a first electrode and a second electrode are formed on the element main surface; a first conductive member electrically connected to the first electrode; a second conductive member electrically connected to the second electrode; and a sealing resin configured to cover part of the first conductive member, part of the second conductive member, and the semiconductor element.

13 Claims, 21 Drawing Sheets

SEMICONDUCTOR DEVICE MOUNTED ON CIRCUIT BOARD OF ELECTRONIC DEVICE

CROSS-REFERENCE TO RELATED APPLICATION

This application is based upon and claims the benefit of priority from Japanese Patent Application No. 2018-082981, filed on Apr. 24, 2018, the entire contents of which are incorporated herein by reference.

TECHNICAL FIELD

The present disclosure relates to a semiconductor device including a semiconductor element.

BACKGROUND

Various configurations of semiconductor devices have been proposed. As an example of a conventional semiconductor device, the semiconductor device includes a semiconductor element, a plurality of leads, a conductive metal plate (hereinafter, referred to as a "strap member"), and a sealing resin. The semiconductor element is electrically connected to each of the plurality of leads, and is electrically connected to one of the plurality of leads via the strap member. The strap member is bonded so as to cover almost the entire surface of an electrode formed on an upper surface of the semiconductor element. The sealing resin covers the semiconductor element, part of the plurality of leads, and the strap member.

In the conventional semiconductor device, the thermal expansion coefficients of the strap member and the semiconductor element are not necessarily equal. Therefore, thermal stress caused by a difference in the thermal expansion coefficients is generated in a region where the strap member and the semiconductor element are bonded, and the semiconductor element may be damaged. Thus, there is a possibility that the reliability of the semiconductor device is deteriorated.

SUMMARY

Some embodiments of the present disclosure provide a semiconductor device with improved reliability.

According to one embodiment of the present disclosure, there is provided a semiconductor device, including: a semiconductor element which includes an element main surface and an element rear surface that face opposite sides in a thickness direction and in which a first electrode and a second electrode are formed on the element main surface; a first conductive member electrically connected to the first electrode; a second conductive member electrically connected to the second electrode; and a sealing resin configured to cover part of the first conductive member, part of the second conductive member, and the semiconductor element, wherein the first conductive member includes a first pad part overlapping with the semiconductor element as viewed in the thickness direction, and wherein the first pad part includes: a bonding surface bonded to the first electrode; a first pad main surface facing a direction opposite to the bonding surface in the thickness direction; and a non-bonding portion which includes an inner surface extending from the bonding surface toward the first pad main surface and is not bonded to the first electrode.

According to one embodiment of the present disclosure, the second electrode includes: a pad electrode portion to which the second conductive member is bonded; and a finger electrode portion for reducing an internal resistance of the second electrode, and the non-bonding portion is configured to overlap with the finger electrode portion as viewed in the thickness direction.

According to one embodiment of the present disclosure, the semiconductor element includes an insulating film configured to cover the finger electrode portion.

According to one embodiment of the present disclosure, the semiconductor element is 0.05 to 0.3 mm square as viewed in the thickness direction.

According to one embodiment of the present disclosure, the first conductive member further includes: a first exposure part protruding from the sealing resin as viewed in the thickness direction; and a first connection part which is covered with the sealing resin and is connected to the first pad part and the first exposure part.

According to one embodiment of the present disclosure, the first exposure part includes: a first bent part which is connected to the first connection part and is bent in the thickness direction; and a first terminal part connected to the first bent part.

According to one embodiment of the present disclosure, the device further includes a third conductive member on which the semiconductor element is mounted, wherein a third electrode is formed on the element rear surface of the semiconductor element, and wherein the third conductive member is electrically connected to the third electrode.

According to one embodiment of the present disclosure, the sealing resin includes a resin rear surface facing the same direction as the element rear surface, the third conductive member includes a mounting surface facing the same direction as the element rear surface and exposed from the resin rear surface, and the first terminal part is configured to overlap with the third conductive member as viewed in a first direction orthogonal to the thickness direction.

According to one embodiment of the present disclosure, the second conductive member includes: a second pad part bonded to the second electrode; a second exposure part protruding from the sealing resin as viewed in the thickness direction; and a second connection part covered with the sealing resin and connected to the second pad part and the second exposure part.

According to one embodiment of the present disclosure, the second exposure part includes: a second bent part connected to the second connection part and bent in the thickness direction; and a second terminal part connected to the second bent part.

According to one embodiment of the present disclosure, the second terminal part is configured to overlap with the third conductive member as viewed in the first direction.

According to one embodiment of the present disclosure, the non-bonding portion further includes a bottom surface connected to the inner surface and facing the same direction as the bonding surface.

According to one embodiment of the present disclosure, the non-bonding portion includes a plurality of recesses, and each of the plurality of recesses extends in a first direction orthogonal to the thickness direction and is arranged in a second direction orthogonal to both the thickness direction and the first direction.

According to one embodiment of the present disclosure, each of the plurality of recesses is connected from an edge on a first side of the first pad part in the first direction to an edge on a second side of the first pad part in the first direction.

According to one embodiment of the present disclosure, at least part of the first pad main surface is exposed from the sealing resin. The sealing resin includes: a resin main surface facing the same direction as the element main surface; and a resin recess recessed from the resin main surface. The resin recess includes: a resin recess bottom surface; and a resin recess side surface connected to the resin recess bottom surface and the resin main surface. The resin recess bottom surface and the first pad main surface are flush with each other.

According to one embodiment of the present disclosure, the semiconductor element is a power MOSFET, the first electrode is a source electrode, and the second electrode is a gate electrode.

DETAILED DESCRIPTION

Figure 1:
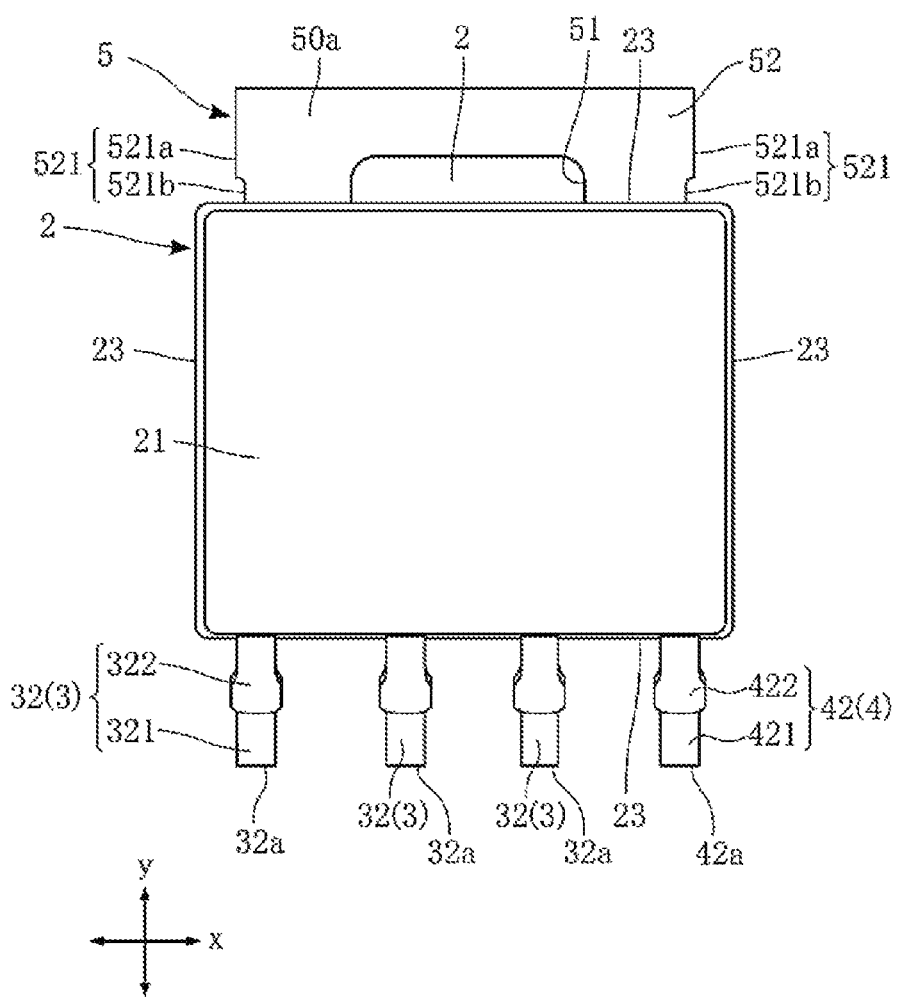
FIG. 1 is a plan view illustrating a semiconductor device according to a first embodiment of the present disclosure.

Embodiments of a semiconductor device according to the present disclosure will now be described in detail with reference to the drawings.

FIGS. 1 to 7 illustrate a semiconductor device according to a first embodiment of the present disclosure. A semiconductor device A1 of the present embodiment includes a semiconductor element 1, a sealing resin 2, a first lead 3, a second lead 4, a third lead 5, and a plurality of conductive binders 6. The semiconductor device A1 is surface-mounted on circuit boards of various electronic devices or the like.

Figure 2:
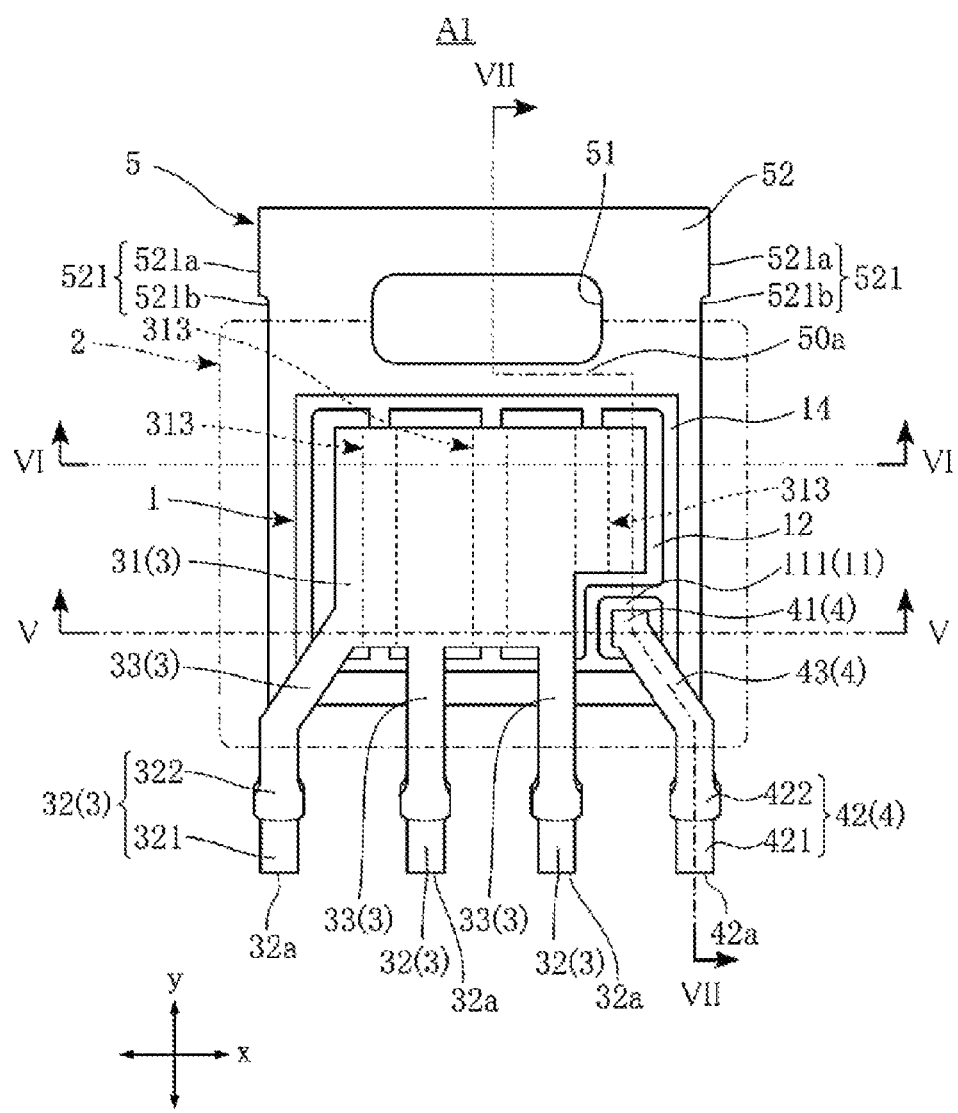
FIG. 2 is a view in which a sealing resin is transmitted in the plan view illustrated in FIG. 1.
Figure 3:
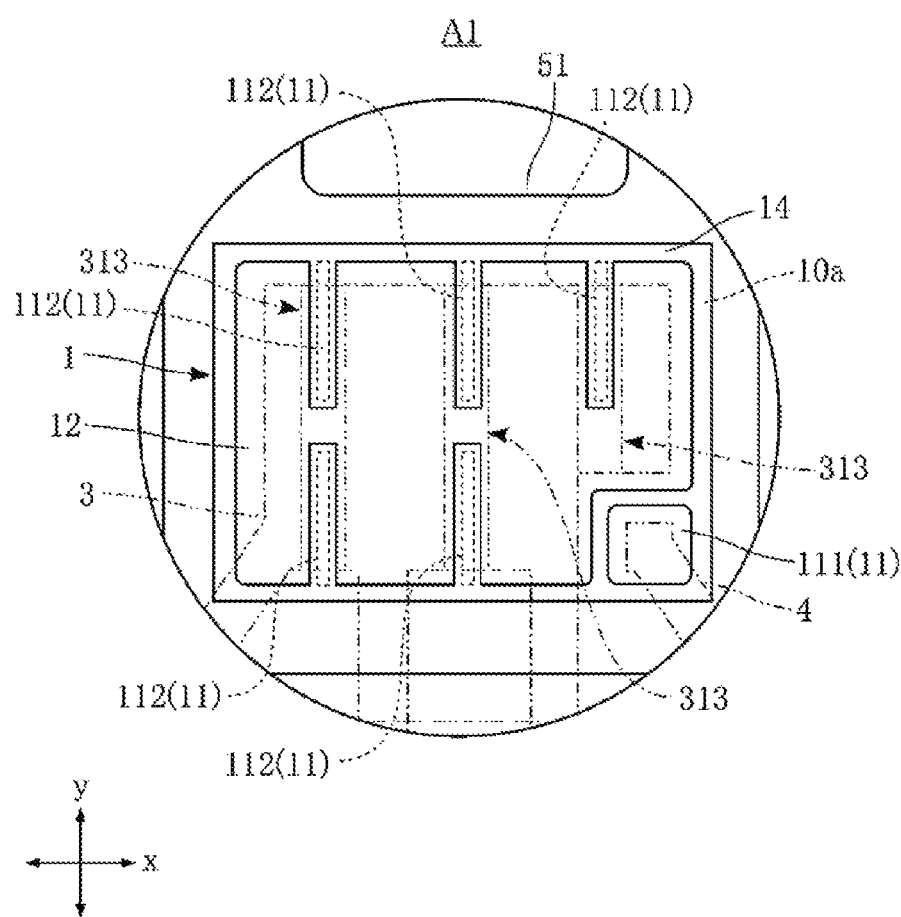
FIG. 3 is an enlarged view of a main enlarging part of FIG. 2.
Figure 4:
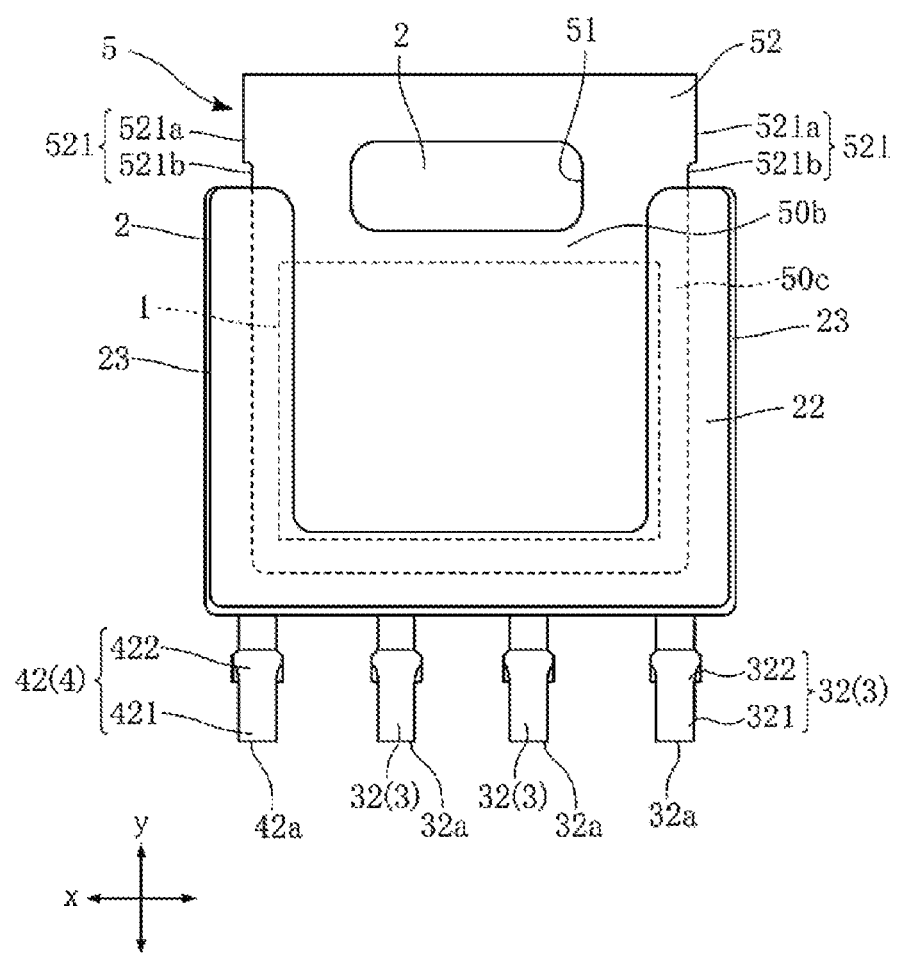
FIG. 4 is a bottom view illustrating the semiconductor device according to the first embodiment.
Figure 5:
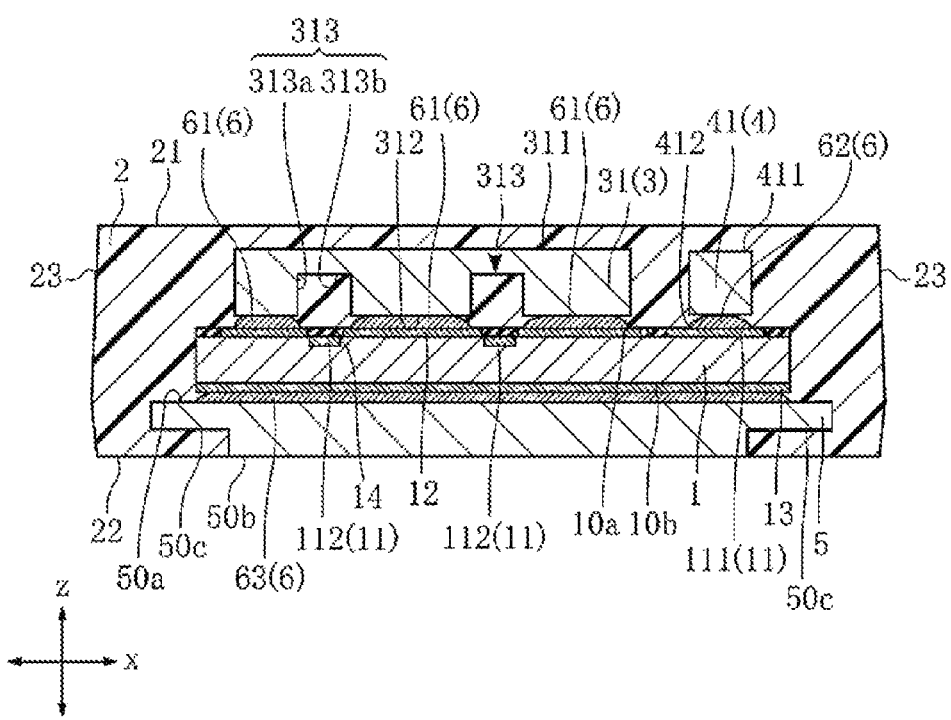
FIG. 5 is a cross-sectional view taken along line V-V in FIG. 2.
Figure 6:
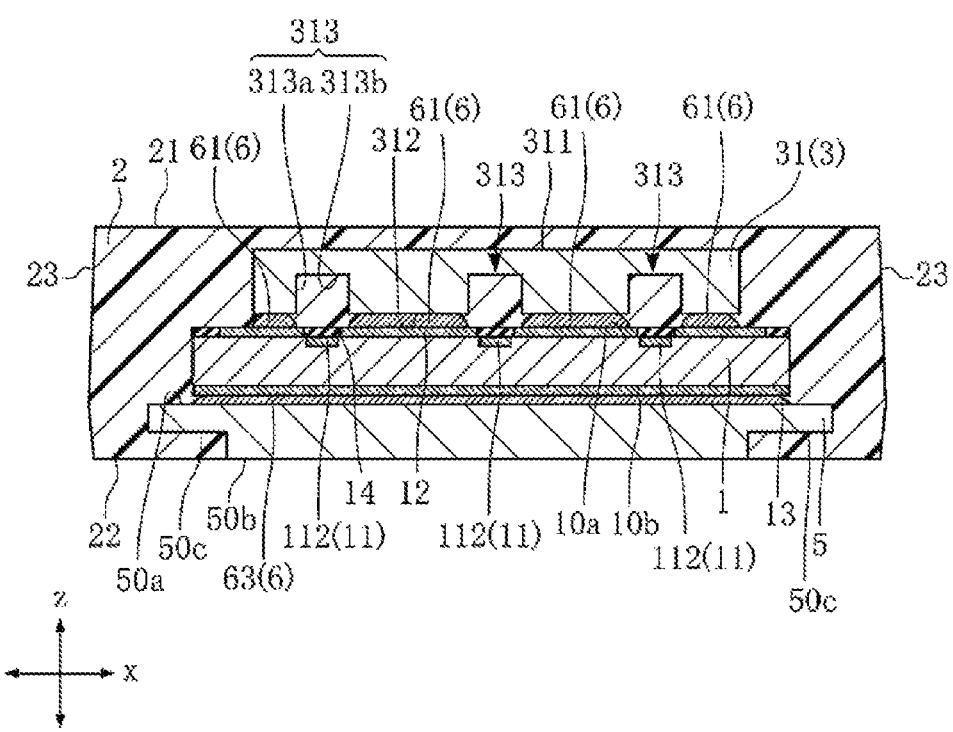
FIG. 6 is a cross-sectional view taken along line VI-VI in FIG. 2.
Figure 7:
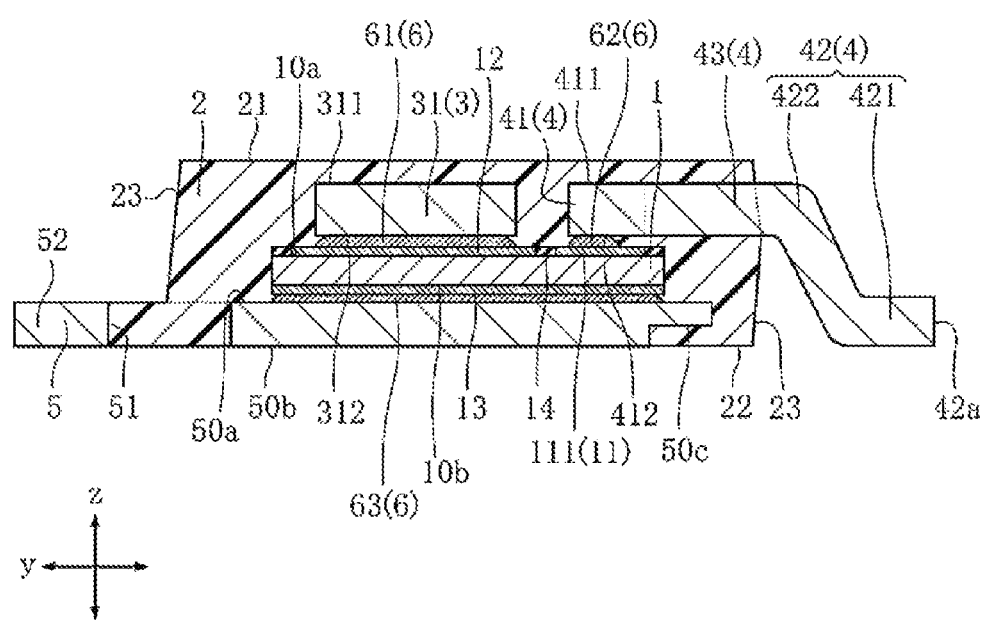
FIG. 7 is a cross-sectional view taken along line VII-VII in FIG. 2.

FIG. 1 is a plan view illustrating the semiconductor device A1. FIG. 2 is a view in which the sealing resin 2 is transmitted in the plan view illustrated in FIG. 1. FIG. 3 is an enlarged view of a main enlarging part of FIG. 2. In FIG. 3, each conductive binder 6 is omitted and the first lead 3 and the second lead 4 are transmitted. FIG. 4 is a bottom view illustrating the semiconductor device A1. FIG. 5 is a cross-sectional view taken along line V-V shown in FIG. 2. FIG. 6 is a cross-sectional view taken along line VI-VI shown in FIG. 2. FIG. 7 is a cross-sectional view taken along line VII-VII shown in FIG. 2. For convenience of description, three directions orthogonal to each other are defined as an x direction, a y direction, and a z direction, respectively. The z direction is a thickness direction of the semiconductor device A1. The x direction is a lateral direction in the plan view of the semiconductor device A1. The y direction is a vertical direction in the plan view of the semiconductor device A1. The x direction, the y direction, and the z direction correspond to a "second direction," a "first direction," and a "thickness direction," respectively as described in the claims.

The semiconductor element 1 is an element that performs the electrical function of the semiconductor device A1. In the present embodiment, the semiconductor element 1 is a three-terminal element including three electrodes, for example, a power MOSFET. The semiconductor element 1 is not limited to the three-terminal element, but may be a two-terminal element such as a diode or the like. In the present embodiment, the semiconductor element 1 has a rectangular shape as viewed in the z direction (hereinafter, also referred to as "as viewed from the plane"). The dimension of the semiconductor element 1 as viewed from the plane is 0.05 to 0.3 mm square.

The semiconductor element 1 includes an element main surface 10a and an element rear surface 10b. The element main surface 10a and the element rear surface 10b are separated in the z direction, and face opposite sides. In the present embodiment, when the semiconductor device A1 is mounted on a circuit board, the element rear surface 10b faces the circuit board. Both the element main surface 10a and the element rear surface 10b are flat.

The semiconductor element 1 includes a gate electrode 11, a source electrode 12, a drain electrode 13, and a passivation film 14. In the present embodiment, the gate electrode 11, the source electrode 12, and the drain electrode 13 correspond to a "second electrode," a "first electrode," and a "third electrode," respectively as described in the claims. In addition, the passivation film 14 corresponds to an "insulating film" described in the claims.

The gate electrode 11 and the source electrode 12 are formed on the element main surface 10a. The area of the gate electrode 11 is smaller than the area of the source electrode 12. The drain electrode 13 is formed on the element rear surface 10b.

In the semiconductor element 1, the gate electrode 11 includes a pad electrode portion 111 and a plurality of finger electrode portions 112. The pad electrode portion 111 and the plurality of finger electrode portions 112 are electrically connected inside the semiconductor element 1.

The pad electrode portion 111 is a portion for bonding the second lead 4. The pad electrode portion 111 has a rectangular shape as viewed from the plane. Each finger electrode portion 112 serves to reduce the internal resistance (gate resistance) of the gate electrode 11. Each finger electrode portion 112 is covered with the passivation film 14. Thus, each finger electrode portion 112 is arranged inside the semiconductor element 1. In the present embodiment, as illustrated in FIG. 3, each finger electrode portion 112 extends along the y direction, and has a rectangular shape as viewed from the plane. Furthermore, as illustrated in FIG. 3, three finger electrode portions 112 are arranged in the x direction on one side (upper side in FIG. 3) of the element main surface 10a in the y direction, and two finger electrode portions 112 are arranged in the x direction on the other side (lower side in FIG. 3) of the element main surface 10a in the y direction. The source electrode 12 is divided into several parts by each finger electrode portion 112.

The passivation film 14 is a protective film of the semiconductor element 1 formed so as to cover the element main surface 10a. The passivation film 14 is, for example, an $Si_3N_4$ layer or an $SiO_2$ layer formed by a plasma CVD method, or a polyimide resin layer formed by coating. Or, it may be formed by a combination thereof. Both the pad electrode portion 111 of the gate electrode 11 and the source electrode 12 are exposed from the passivation film 14.

The sealing resin 2 covers part of each of the first lead 3, the second lead 4, and the third lead 5, and the semiconductor element 1. The sealing resin 2 is formed as, for example, a black epoxy resin. The sealing resin 2 is formed by, for example, molding. In the present embodiment, the sealing resin 2 has a rectangular shape as viewed from the plane. The material, forming method, and shape of the sealing resin 2 are not limited to those described above. As illustrated in FIGS. 1 and 4 to 7, the sealing resin 2 includes a resin main surface 21, a resin rear surface 22, and a plurality of resin side surfaces 23.

The resin main surface 21 and the resin rear surface 22 face opposite sides in the thickness direction z. The resin main surface 21 faces the same direction as the element main surface 10a. The resin rear surface 22 faces the same direction as the element rear surface 10b. The plurality of resin side surfaces 23 are connected to the resin main surface 21 and the resin rear surface 22. In the present embodiment, as illustrated in FIGS. 5 to 7, each resin side surface 23 is orthogonal to both the resin main surface 21 and the resin rear surface 22. Furthermore, each resin side surface 23 is flat. Also, each resin side surface 23 may be slightly inclined with respect to the thickness direction z.

The first lead 3, the second lead 4, and the third lead 5 are each electrically connected to the semiconductor element 1. The first lead 3, the second lead 4, and the third lead 5 are made of metal. In the present embodiment, it is assumed that the main component of the metal is copper (Cu), but it may be nickel (Ni), an alloy of Cu or Ni, a 42 alloy, or the like. The respective materials of the first lead 3, the second lead 4, and the third lead 5 are not limited to those described above. The first lead 3, the second lead 4, and the third lead 5 are formed in a predetermined shape by, for example, metal press working (stamping working).

The first lead 3 is a conductive member that is electrically connected to the source electrode 12 of the semiconductor element 1. In the present embodiment, the first lead 3 corresponds to a "first conductive member" described in the claims. The first lead 3 includes a first pad part 31, a plurality of first exposure parts 32, and a plurality of first connection parts 33.

The first pad part 31 is a part for bonding to the source electrode 12 of the semiconductor element 1. The first pad part 31 overlaps with the source electrode 12 as viewed from the plane. In the present embodiment, the first pad part 31 is covered with the sealing resin 2. The first pad part 31 includes a first pad main surface 311 and a first pad bonding surface 312, and further includes a plurality of recesses 313.

As illustrated in FIGS. 5 and 6, the first pad main surface 311 faces the same direction as the element main surface 10a of the semiconductor element 1. In the present embodiment, the first pad main surface 311 is flat. Furthermore, the first pad main surface 311 is covered with the sealing resin 2.

The first pad bonding surface 312 faces the same direction as the element rear surface 10b of the semiconductor element 1. Therefore, the first pad bonding surface 312 faces the opposite side to the first pad main surface 311. The first pad bonding surface 312 faces the semiconductor element 1 and is bonded to the source electrode 12 via part of the conductive binder 6 (first binders 61 as described below). The first pad bonding surface 312 corresponds to a "bonding surface" described in the claims.

Each of the plurality of recesses 313 is a portion recessed in the z direction from the first pad bonding surface 312. In the present embodiment, three recesses 313 are formed in the first pad part 31. As illustrated in FIG. 2, each recess 313 extends in the y direction as viewed from the plane. In the present embodiment, each recess 313 is connected from one end edge of the first pad part 31 in the y direction to the other end edge thereof in the y direction. As illustrated in FIG. 3, each recess 313 overlaps with the finger electrode portion 112 of the gate electrode 11 as viewed from the plane. In the present embodiment, the recess 313 corresponds to a "non-bonding portion" described in the claims. Each recess 313 includes a plurality of recess inner surfaces 313a and recess bottom surfaces 313b.

The plurality of recess inner surfaces 313a each extend from the first pad bonding surface 312 toward the first pad main surface 311. In the present embodiment, each recess 313 includes two recess inner surfaces 313a. Each recess inner surface 313a is flat. Each recess inner surface 313a is orthogonal to both the first pad bonding surface 312 and the recess bottom surface 313b. Also, each recess inner surface 313a may be a curved surface or may be inclined with respect to the z direction. In the present embodiment, the recess inner surface 313a corresponds to an "inner surface" described in the claims.

The recess bottom surface 313b is connected to the plurality of recess inner surfaces 313a in each recess 313. The recess bottom surface 313b faces the same direction as the first pad bonding surface 312 and is arranged closer to the first pad main surface 311 side in the z direction than the first pad bonding surface 312. In the present embodiment, the recess bottom surface 313b is flat. The recess bottom surface 313b is not limited to the flat surface, but may be, for example, a curved surface.

Each of the plurality of first exposure parts 32 is exposed from the sealing resin 2. In the present embodiment, each first exposure part 32 protrudes from one (the lower side in the plan view (see FIG. 1)) of two resin side surfaces 23 facing in the y direction of the sealing resin 2 as viewed from the plane. In the present embodiment, there are three first exposure parts 32, but the number of the first exposure parts 32 is not limited. The plurality of first exposure parts 32 are arranged in the x direction. The plurality of first exposure parts 32 overlap with each other as viewed in the x direction. As illustrated in FIGS. 1, 2 and 4, each first exposure part 32 includes a first leading end surface 32a. The first leading end surface 32a is a surface that faces one side (the lower side in FIG. 1) in the y direction. In the present embodiment, each first exposure part 32 is covered with plating (not shown) except each first leading end surface 32a. Therefore, a base material (Cu in the present embodiment) of the first lead 3 is exposed on each first leading end surface 32a. Also, each first leading end surface 32a may be covered with plating. Each first exposure part 32 includes a first terminal part 321 and a first bent part 322.

Each first terminal part 321 functions as a terminal for mounting the semiconductor device A1 on a circuit board or the like. In the present embodiment, since the first lead 3 is electrically connected to the source electrode 12 of the semiconductor element 1, each first terminal part 321 is a source terminal of the semiconductor device A1.

One end edge of each first bent part 322 in the y direction is connected to the first connection part 33 and the other end edge thereof in the y direction is connected to the first terminal part 321, as viewed from the plane. Each first bent part 322 is bent in the z direction. Each first bent part 322 is bent in a gull wing shape.

Each of the plurality of first connection parts 33 is covered with the sealing resin 2. Each first connection part 33 connects the first pad part 31 and each first exposure part 32. Each first connection part 33 is formed for each first exposure part 32. In the present embodiment, since there are three first exposure parts 32, there are also three first connection parts 33. Each first connection part 33 is located in a direction in which the element main surface 10a faces, rather than each first terminal part 321 in the z direction.

The second lead 4 is a conductive member that is electrically connected to the gate electrode 11 of the semiconductor element 1. In the present embodiment, the second lead 4 corresponds to a "second conductive member" described in the claims. The second lead 4 includes a second pad part 41, a second exposure part 42, and a second connection part 43.

The second pad part 41 is a part for bonding to the gate electrode 11 (the pad electrode portion 111) of the semiconductor element 1. The second pad part 41 overlaps with the gate electrode 11 of the semiconductor element 1 as viewed from the plane. The second pad part 41 is covered with the sealing resin 2. In the present embodiment, the second pad part 41 has a rectangular shape as viewed from the plane. The second pad part 41 includes a second pad main surface 411 and a second pad bonding surface 412.

As illustrated in FIGS. 5 and 7, the second pad main surface 411 faces the same direction as the element main surface 10a of the semiconductor element 1. In the present embodiment, the second pad main surface 411 is flat. Furthermore, the second pad main surface 411 is covered with the sealing resin 2.

The second pad bonding surface 412 faces in the same direction as the element rear surface 10b of the semiconductor element 1. Therefore, the second pad bonding surface 412 faces the opposite side to the second pad main surface 411. The second pad bonding surface 412 faces the semiconductor element 1 and is bonded to the gate electrode 11 via part of the conductive binder 6 (a second binder 62 as described below).

The second exposure part 42 is exposed from the sealing resin 2. In the present embodiment, the second exposure part 42 protrudes from one (the lower side in the plan view (see FIG. 1)) of the two resin side surfaces 23 facing the y direction of the sealing resin 2 as viewed from the plane. The second exposure part 42 overlaps with each first exposure part 32 as viewed in the x direction. As illustrated in FIGS. 1, 2, 4, and 7, the second exposure part 42 includes a second leading end surface 42a. The second leading end surface 42a is a surface that faces one side (the lower side in FIG. 1) in the y direction. In the present embodiment, the second exposure part 42 is covered with plating (not shown) except the second leading end surface 42a. Therefore, a base material (Cu in the present embodiment) of the second lead 4 is exposed on the second leading end surface 42a. Also, the second leading end surface 42a may be covered with plating. The second exposure part 42 includes a second terminal part 421 and a second bent part 422.

The second terminal part 421 functions as a terminal for mounting the semiconductor device A1 on a circuit board or the like. In the present embodiment, since the second lead 4 is electrically connected to the gate electrode 11 of the semiconductor element 1, the second terminal part 421 is a gate terminal of the semiconductor device A1.

One end edge of the second bent part 422 in the y direction is connected to the second connection part 43 and the other end edge thereof in the y direction is connected to the second terminal part 421, as viewed from the plane. The second bent part 422 is bent in the z direction. The second bent part 422 is bent in a gull wing shape.

The second connection part 43 is covered with the sealing resin 2. The second connection part 43 connects the second pad part 41 and the second exposure part 42. The second connection part 43 is located in a direction in which the element main surface 10a faces, rather than the second terminal part 421 in the z direction.

The third lead 5 is a conductive member that is electrically connected to the drain electrode 13 of the semiconductor element 1. In the present embodiment, the third lead 5 corresponds to a "third conductive member" described in the claims. The third lead 5 is plate-shaped, and has a rectangular shape as viewed from the plane. The third lead 5 includes a loading surface 50a, a mounting surface 50b, and a mounting surface side recess 50c. The loading surface 50a and the mounting surface 50b are separated from each other and face opposite sides in the z direction.

The loading surface 50a faces the same direction as the element main surface 10a of the semiconductor element 1. The semiconductor element 1 is loaded on the loading surface 50a. The loading surface 50a is covered with the sealing resin 2. The loading surface 50a is flat.

The mounting surface 50b faces the same direction as the element rear surface 10b of the semiconductor element 1. When the semiconductor device A1 is mounted on a circuit board, the mounting surface 50b faces the circuit board. The mounting surface 50b is exposed from the sealing resin 2. The mounting surface 50b is flat. In the present embodiment, since the third lead 5 is electrically connected to the drain electrode 13 of the semiconductor element 1, the mounting surface 50b becomes a drain terminal of the semiconductor device A1.

The mounting surface side recess 50c is a portion recessed in the z direction from the mounting surface 50b. In the present embodiment, as illustrated in FIGS. 4 to 7, the mounting surface side recess 50c is a portion of the third lead 5, which overlaps with the sealing resin 2 as viewed from the plane, and is formed on the outer side. By the mounting surface side recess 50c, the third lead 5 includes a thick portion and a thin portion. The mounting surface side recess 50c is covered with the sealing resin 2. The third lead 5 may not include the mounting surface side recess 50c. However, the third lead 5 can be suppressed from coming off from the sealing resin 2 by the presence of the mounting surface side recess 50c in the third lead 5.

In addition, the third lead 5 includes a third exposure part 52 exposed from the sealing resin 2 as viewed from the plane. As illustrated in FIGS. 1, 2, and 4, the third exposure part 52 includes a pair of exposed side surfaces 521. The pair of exposed side surfaces 521 respectively face opposite sides in the x direction. Each of the pair of exposed side surfaces 521 includes an exposed side surface first portion 521a and an exposed side surface second portion 521b. In each exposed side surface 521, the exposed side surface first portion 521a is flat. The exposed side surface second portion 521b is connected to the exposed side surface first portion 521a, and is recessed inward from the exposed side surface first portion 521a as viewed from the plane. A portion of the third lead 5, which is exposed from the sealing resin 2, is covered with plating (not shown) except each exposed side surface first portion 521a. Therefore, a base material (Cu in the present embodiment) of the third lead 5 is exposed in each exposed side surface first portion 521a. Also, each exposed side surface first portion 521a may be covered with plating.

In the present embodiment, a through hole 51 is formed in the third lead 5. The through hole 51 may not be formed. The through hole 51 is filled with the sealing resin 2. In the present embodiment, as illustrated in FIG. 2, the through hole 51 has a rectangular shape as viewed from the plane, but the shape as viewed from the plane is not limited. The through hole 51 is connected from the loading surface 50a to the mounting surface 50b in the z direction.

In the present embodiment, the plurality of first terminal parts 321 and the second terminal part 421 overlap with each other as viewed in the x direction. In addition, the plurality of first terminal parts 321 and the second terminal part 421 each overlap with the third lead 5 as viewed in the y direction. In the present embodiment, the lower surfaces of the plurality of first terminal parts 321 in the z direction (the surfaces facing the same direction as the element rear surface 10b), the lower surface of the second terminal part 421 in the z direction (the surface facing the same direction as the element rear surface 10b), and the mounting surface 50b of the third lead 5 are arranged at substantially the same position in the z direction. Therefore, the semiconductor device A1 can be surface-mounted on the circuit board and the semiconductor device A1 can be surface-mounted in a stable posture.

In the present embodiment, the semiconductor element 1 is held by the first lead 3 and the second lead 4, and the third lead 5.

The plurality of conductive binders 6 are made of, for example, solder or Ag paste. The material of each of the conductive binders 6 is not limited to the aforementioned ones. The plurality of conductive binders 6 include a plurality of first binders 61, a second binder 62, and a third binder 63.

Each of the plurality of first binders 61 bonds the first pad part 31 and the source electrode 12 and electrically connects them. In the present embodiment, each first binder 61 is interposed between the first pad bonding surface 312 of the first pad part 31 and the source electrode 12.

The second binder 62 bonds the second pad part 41 and the gate electrode 11 and electrically connects them. In the present embodiment, the second binder 62 is interposed between the second pad bonding surface 412 of the second pad part 41 and the pad electrode portion 111 of the gate electrode 11.

The third binder 63 bonds the third lead 5 (loading surface 50a) and the drain electrode 13 and electrically connects them. In the present embodiment, the third binder 63 is interposed between the loading surface 50a of the third lead 5 and the drain electrode 13.

Next, operational effects of the semiconductor device A1 will be described.

According to the semiconductor device A1, the first pad part 31 of the first lead 3 includes the plurality of recesses 313. With this configuration, a non-bonding portion that is not bonded to the source electrode 12 of the semiconductor element 1 is formed in the first pad part 31. Thus, it is possible to reduce a region where the semiconductor element 1 is constrained by the first lead 3 (the first pad part 31). This makes it possible to alleviate the stress applied to the semiconductor element 1 by, for example, a difference in thermal expansion coefficients of the first lead 3 and the semiconductor element 1. Accordingly, since damage to the semiconductor element 1 can be prevented, the reliability of the semiconductor device A1 is improved.

According to the semiconductor device A1, the plurality of recesses 313 formed in the first pad part 31 of the first lead 3 overlap with the finger electrode portions 112 of the gate electrode 11 of the semiconductor element 1 as viewed from the plane. In the conventional semiconductor device, a binder is arranged on (bonded to) almost the entire surface of the source electrode 12. When such a configuration is applied to the semiconductor device A1, the conductive binder 6 (the first binder 61) is also arranged on the passivation film 14 covering the finger electrode portion 112. As a result, the semiconductor element 1 may be damaged by a difference in thermal expansion coefficients caused by a difference in materials of the passivation film 14 and the first binder 61. On the other hand, in the present embodiment, as described above, since the plurality of recesses 313 overlap with the finger electrode portions 112 as viewed from the plane, the first binder 61 is not arranged on the passivation film 14 by each recess 313 formed in the first pad part 31. Thus, it is possible to prevent the semiconductor element 1 from being damaged.

Figure 8:
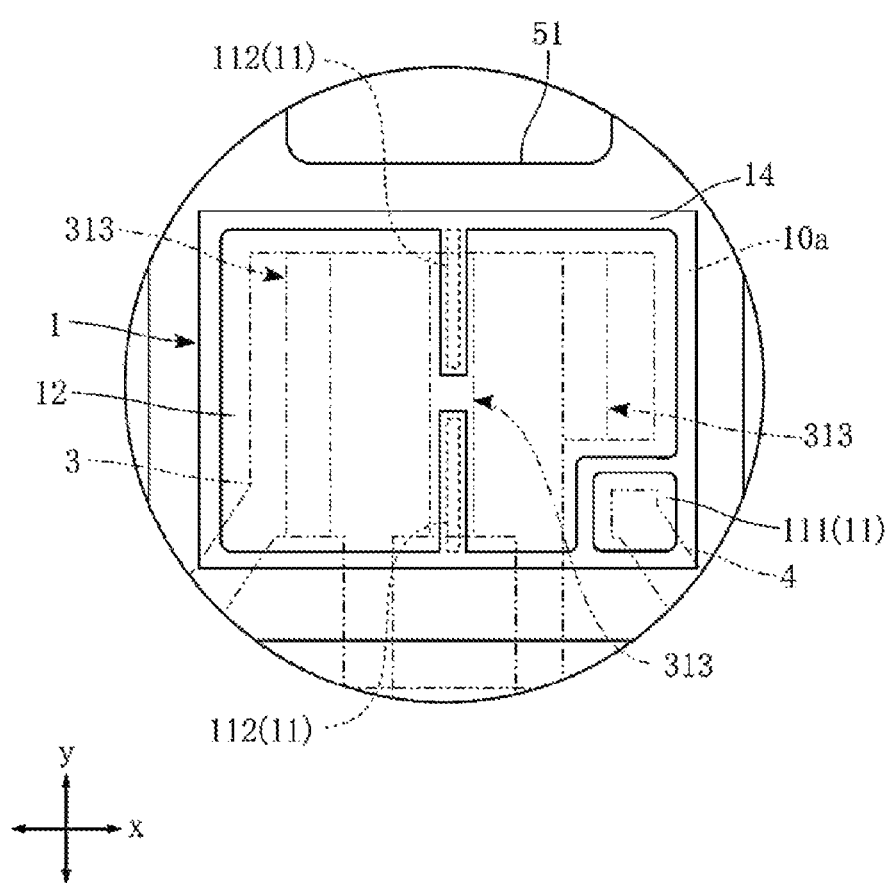
FIG. 8 is an enlarged plan view of a main part illustrating a semiconductor element according to a modification example.
Figure 9:
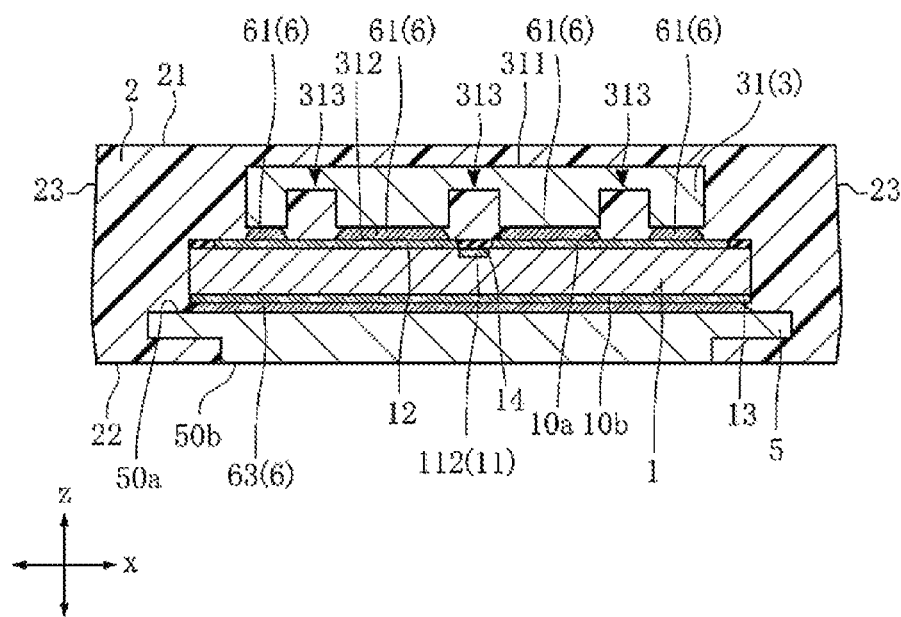
FIG. 9 is a cross-sectional view illustrating a semiconductor element according to a modification example.
Figure 10:
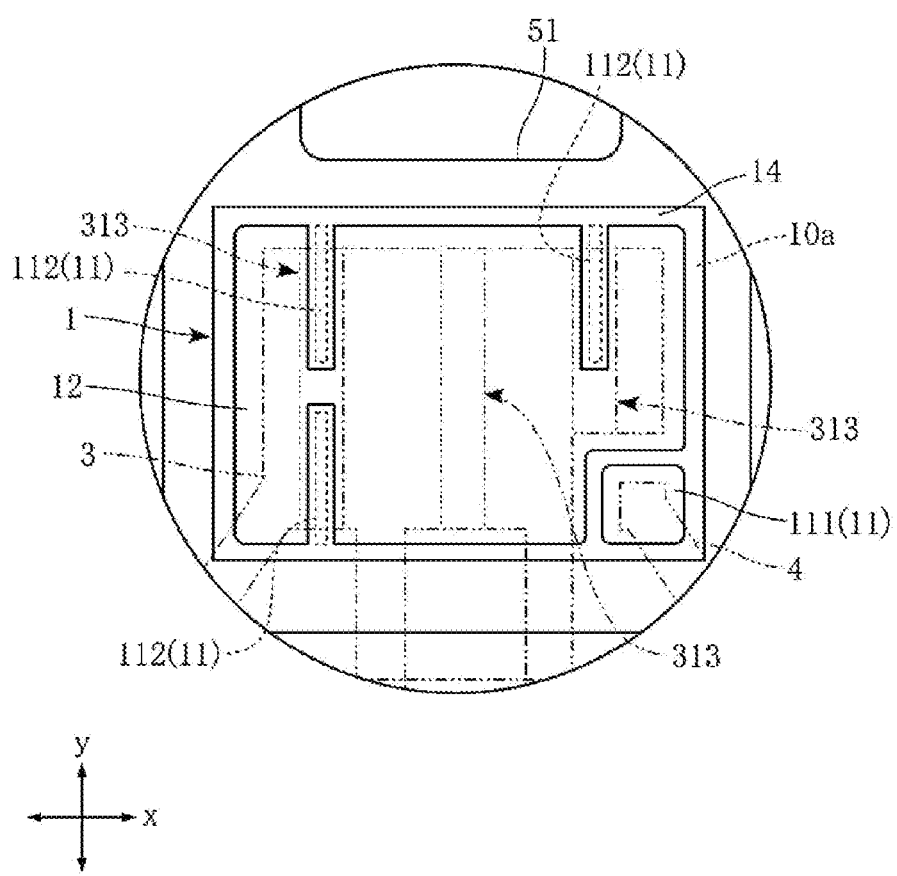
FIG. 10 is an enlarged plan view of a main part illustrating a semiconductor element according to a modification example.
Figure 11:
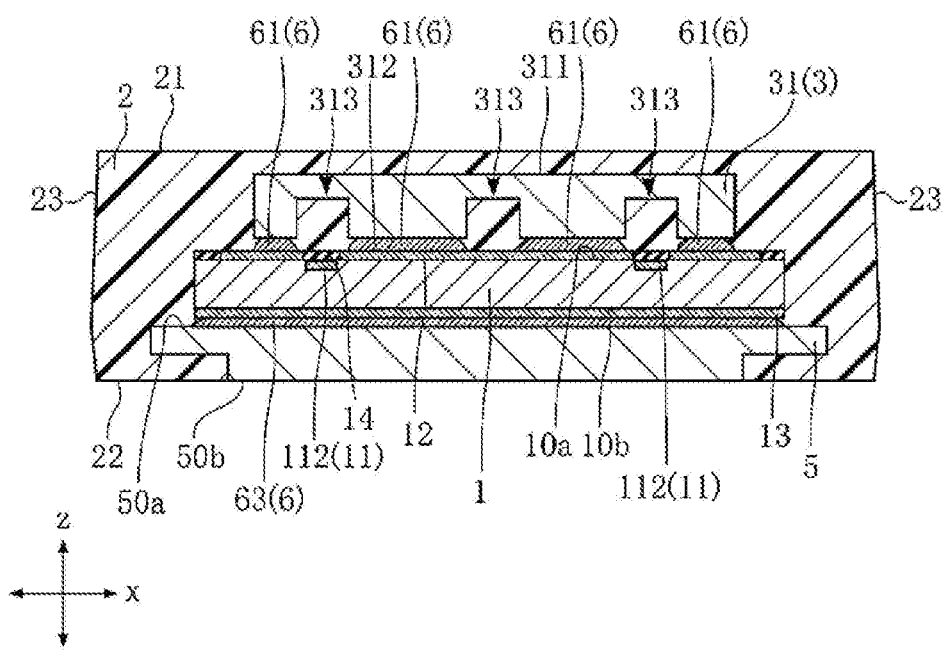
FIG. 11 is a cross-sectional view illustrating a semiconductor element according to a modification example.

According to the semiconductor device A1, the three recesses 313 are formed in the first pad part 31. In the semiconductor device A1, the dimension of the semiconductor element 1 as viewed from the plane is about 0.05 to 0.3 mm square. In the semiconductor element 1 whose dimension as viewed from the plane is just that dimension, the number of the finger electrode portions 112 arranged in the x direction is often three or smaller. That is, the number of the finger electrode portions 112 arranged in the x direction may be one or two. For example, FIGS. 8 and 9 illustrate a case where the number of the finger electrode portions 112 arranged in the x direction is one, and FIGS. 10 and 11 illustrate a case where the number of the finger electrode portions 112 arranged in the x direction is two. FIGS. 8 and 10 are enlarged views of a main part corresponding to that of FIG. 3. FIGS. 9 and 11 are cross-sectional views (see FIG. 6) corresponding to the cross section taken along line VI-VI in FIG. 2. As illustrated in these drawings, in any case, the finger electrode portions 112 overlap with any of the plurality of recesses 313 as viewed from the plane. Therefore, the first lead 3 having the aforementioned shape can be used regardless of the arrangement of the finger electrode portions 112 of the gate electrode 11 formed in the semiconductor element 1. In other words, since there is no need to change the arrangement of the plurality of recesses 313 formed in the first lead 3 according to the semiconductor element 1, the first lead 3 does not need to be redesigned according to the semiconductor element 1 to be used. For example, when the semiconductor element 1 includes one finger electrode portion 112, the first pad part 31 (first lead 3) can be designed so that one recess 313 is arranged on the one finger electrode portion 112. However, in the first lead 3 thus designed, when the semiconductor element 1 includes two finger electrode portions 112, it cannot be used as it is and the first pad part 31 needs to be designed so that two recesses 313 are arranged according to the arrangement of the two finger electrode portions 112. Therefore, the first lead 3 (the arrangement of the recesses 313 of the first pad part 31) needs to be uniformly designed according to the finger electrode portions 112 installed in the semiconductor element 1. On the other hand, in the semiconductor device A1, the plurality of recesses 313 are formed in the first pad part 31. Therefore, even in the case of the semiconductor element 1 in which the number and arrangement of the finger electrode portions 112 are different, the first lead 3 can be diverted. Thus, it is possible to improve the productivity of the semiconductor device A1 by using the first lead 3 including the first pad part 31 in which the plurality of recesses 313 are formed.

According to the semiconductor device A1, the plurality of recesses 313 are formed in the first pad part 31. Thus, it is possible to reduce the sectional area of the first pad part 31 in the plane (x-z plane) orthogonal to the y direction and to increase the surface area thereof compared with the case of a plate shape where no recess 313 is formed. Accordingly, even when a current with a high frequency flows through the first pad part 31, it is possible to suppress an increase in resistance by a skin effect.

According to the semiconductor device A1, the first lead 3 is directly bonded to the source electrode 12 of the semiconductor element 1. Thus, it is possible to reduce the internal resistance of the semiconductor device A1 compared with the case of being electrically connected via a bonding wire or a bonding ribbon. Similarly, in the semiconductor device A1, the second lead 4 is directly bonded to the gate electrode 11 of the semiconductor element 1. Thus, it is possible to reduce the internal resistance of the semiconductor device A1 compared with the case of being electrically connected via a bonding wire or a bonding ribbon.

According to the semiconductor device A1, the first lead 3 includes the first exposure part 32 exposed from the sealing resin 2 and the first exposure part 32 is bent by the first bent part 322. With this configuration, it is possible to alleviate the stress applied when the semiconductor device A1 is mounted on the circuit board by the first bent part 322.

In the first embodiment, there has been described a case where each finger electrode portion 112 has a rectangular shape extending in the y direction, but the shape of each finger electrode portion 112 is not limited thereto. For example, the finger electrode portion 112 may be formed in a region, which overlaps with the non-bonding portion (recess 313) of the first pad part 31, of the source electrode 12 as viewed from the plane. That is, the finger electrode portion 112 can be freely arranged as long as it is within a region that overlaps with the non-bonding portion (recess 313) as viewed from the plane.

Next, another embodiment of the semiconductor device according to the present disclosure will be described. In another embodiment as described below, the same or similar elements as those of the first embodiment are denoted by the same reference numerals and a description thereof will be omitted.

Figure 12:
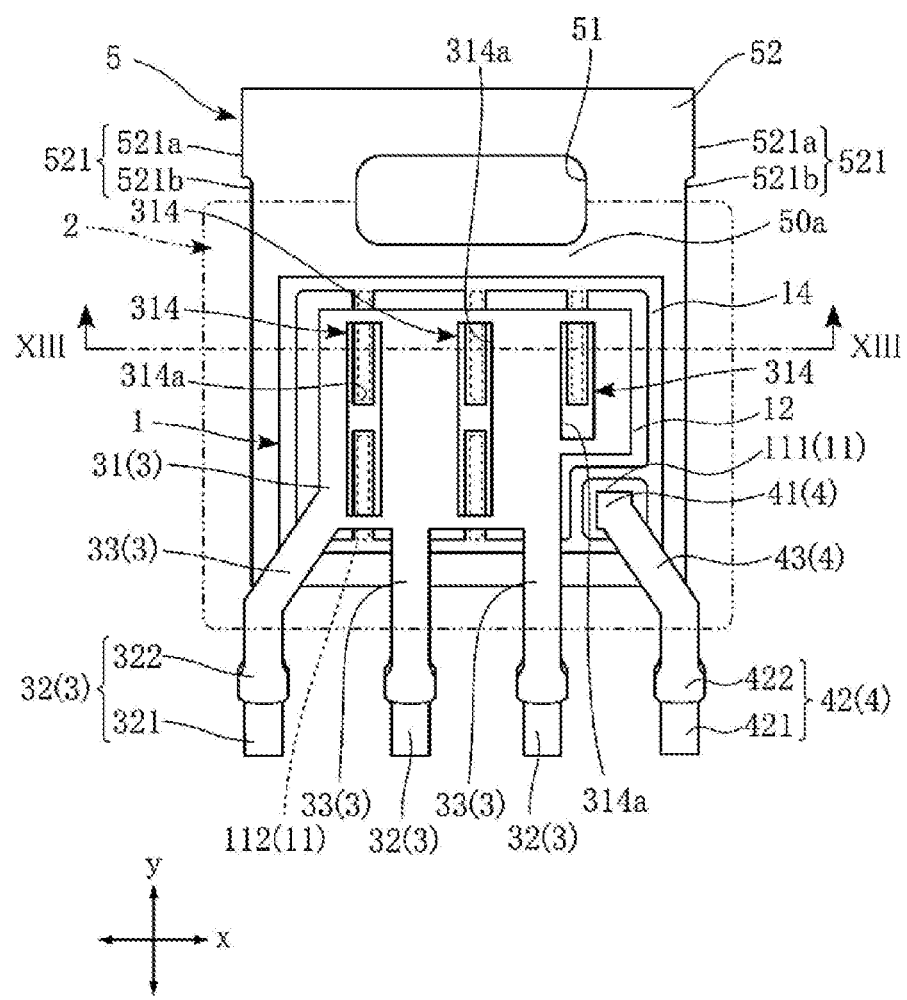
FIG. 12 is a plan view (in which a sealing resin is transmitted) illustrating a semiconductor device according to a second embodiment of the present disclosure.
Figure 13:
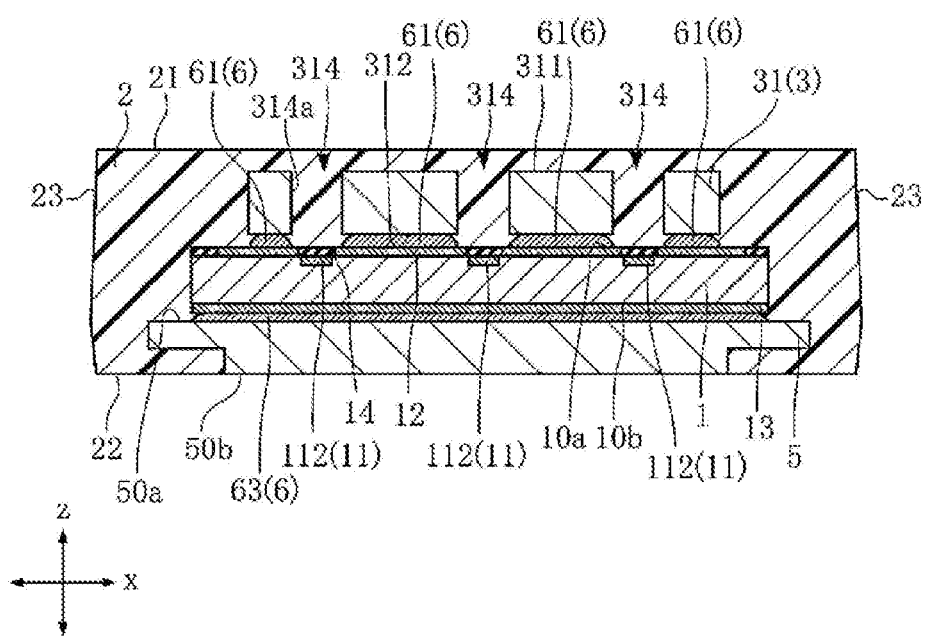
FIG. 13 is a cross-sectional view taken along line XIII-XIII in FIG. 12.

FIGS. 12 and 13 illustrate a semiconductor device according to a second embodiment of the present disclosure. A semiconductor device A2 of the present embodiment is different from the semiconductor device A1 (the first embodiment) in that a plurality of through holes 314, instead of the plurality of recesses 313, are formed in the first pad part 31.

FIG. 12 is a plan view illustrating the semiconductor device A2. In FIG. 12, the sealing resin 2 is transmitted. FIG. 13 is a cross-sectional view taken along line XIII-XIII in FIG. 12. FIG. 13 corresponds to the cross section illustrated in FIG. 6 in the first embodiment.

The plurality of through holes 314 are each connected from the first pad bonding surface 312 to the first pad main surface 311 in the z direction. In the present embodiment, each through hole 314 has a rectangular shape extending in the y direction as viewed from the plane. The shape of each through hole 314 as viewed from the plane is not limited to the rectangular shape, but may be a polygonal shape, a circular shape, or the like. In the present embodiment, each through hole 314 includes a through hole inner surface 314a.

The through hole inner surface 314a is connected from the first pad bonding surface 312 to the first pad main surface 311 in the z direction. In the present embodiment, the through hole inner surface 314a is flat. Furthermore, the through hole inner surface 314a is orthogonal to each of the first pad bonding surface 312 and the first pad main surface 311. Therefore, the through hole inner surface 314a is parallel to the z direction. Also, the through hole inner surface 314a may be inclined with respect to the z direction. In the present embodiment, the through hole 314 corresponds to a "non-bonding portion" described in the claims, and the through hole inner surface 314a corresponds to an "inner surface" described in the claims.

According to the semiconductor device A2, the first pad part 31 of the first lead 3 includes the plurality of through holes 314. With this configuration, a non-bonding portion that is not bonded to the source electrode 12 of the semiconductor element 1 is formed in the first pad part 31. Therefore, similar to the semiconductor device A1, since the semiconductor device A2 can prevent the semiconductor element 1 from being damaged, the reliability of the semiconductor device A2 is improved. Furthermore, in the semiconductor device A2, the portion configured in the same manner as the semiconductor device A1 can have the same effects as those of the semiconductor device A1.

According to the semiconductor device A2, the plurality of through holes 314 are formed in the first pad part 31. Therefore, similar to the plurality of recesses 313, it is possible to reduce the sectional area of the first pad part 31 in the x-z plane and to increase the surface area thereof. Thus, when a current with a high frequency flows, it is possible to reduce the resistance by a skin effect.

Furthermore, when an electric power is supplied to the semiconductor device A2, the semiconductor element 1 generates heat and the heat generated from the semiconductor element 1 is transferred to the first pad part 31. In the first pad part 31 according to the present embodiment, the through holes 314 are formed, and the volume thereof is reduced compared with the first pad part 31 in which the recesses 313 are formed as in the first embodiment. Therefore, the path through which the heat generated from the semiconductor element 1 is transferred is decreased. Thus, the case where the plurality of recesses 313 are formed in the first pad part 31 can improve the heat dissipation of the heat generated from the semiconductor element 1, compared with the case where the plurality of through holes 314 are formed.

Figure 14:
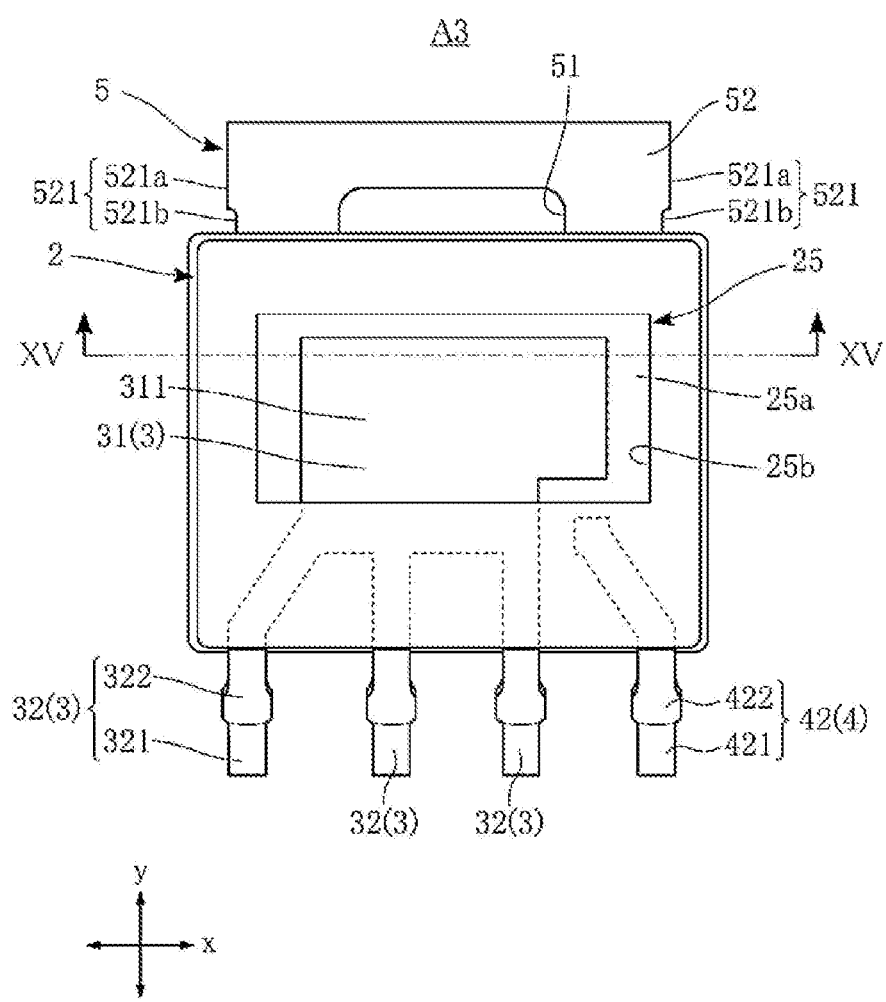
FIG. 14 is a plan view illustrating a semiconductor device according to a third embodiment of the present disclosure.
Figure 15:
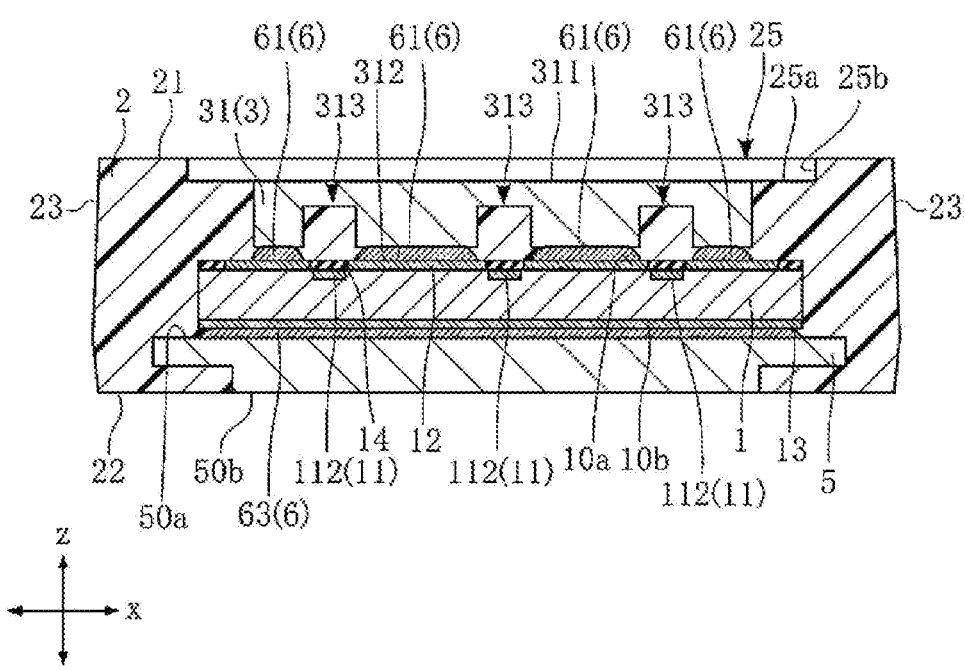
FIG. 15 is a cross-sectional view taken along line XV-XV in FIG. 14.

FIGS. 14 and 15 illustrate a semiconductor device according to a third embodiment of the present disclosure. A semiconductor device A3 of the present embodiment is different from the semiconductor device A1 (the first embodiment) in that part of the first pad main surface 311 of the first pad part 31 is exposed.

FIG. 14 is a plan view illustrating the semiconductor device A3. FIG. 15 is a cross-sectional view taken along line XV-XV in FIG. 14. FIG. 15 corresponds to the cross section illustrated in FIG. 6 in the first embodiment.

In the present embodiment, as illustrated in FIG. 15, the sealing resin 2 includes a resin recess 25 recessed in the z direction from the resin main surface 21. The resin main surface 21 of the sealing resin 2 is opened by the resin recess 25. In the present embodiment, the resin recess 25 has a rectangular shape as viewed from the plane. As illustrated in FIGS. 14 and 15, the resin recess 25 exposes part of the first pad main surface 311 of the first pad part 31. The resin recess 25 includes a resin recess bottom surface 25a and a resin recess side surface 25b.

The resin recess bottom surface 25a faces the same direction as the element main surface 10a of the semiconductor element 1. As illustrated in FIG. 15, the resin recess bottom surface 25a is located between the resin main surface 21 and the resin rear surface 22 in the z direction. The resin recess bottom surface 25a and the first pad main surface 311 are flush with each other as illustrated in FIG. 15.

One end edge of the resin recess side surface 25b is connected to the resin main surface 21 and the other end edge thereof is connected to the resin recess bottom surface 25a in the z direction. However, in the present embodiment, part of the other end edge is in contact with the first pad main surface 311 on the resin recess side surface 25b on the lower side in the y direction in FIG. 14. The resin recess side surface 25b is flat. In the present embodiment, the resin recess side surface 25b is orthogonal to both the resin main surface 21 and the resin recess bottom surface 25a. The resin recess side surface 25b is parallel to the z direction. Also, the resin recess side surface 25b may be inclined with respect to the z direction.

According to the semiconductor device A3, similar to the semiconductor device A1, the first pad part 31 of the first lead 3 includes a plurality of recesses 313. With this configuration, a non-bonding portion that is not bonded to the source electrode 12 of the semiconductor element 1 is formed in the first pad part 31. Therefore, similar to the semiconductor device A1, since the semiconductor device A3 can prevent the semiconductor element 1 from being damaged, the reliability of the semiconductor device A3 is improved. Furthermore, in the semiconductor device A3, the portion configured in the same manner as the semiconductor devices A1 and A2 can have the same effects as those of the semiconductor devices A1 and A2.

According to the semiconductor device A3, the resin recess 25 is formed in the sealing resin 2, and part of the first pad main surface 311 of the first pad part 31 is exposed from the sealing resin 2 in the resin recess 25. When an electric power is supplied to the semiconductor device A3, heat generated from the semiconductor element 1 is transferred to the first pad part 31. Therefore, the heat generated from the semiconductor element 1 can be efficiently released to the outside by exposing part of the first pad main surface 311 from the sealing resin 2 as described above. That is, the semiconductor device A3 is improved in heat dissipation compared with the semiconductor device A1.

Figure 16:
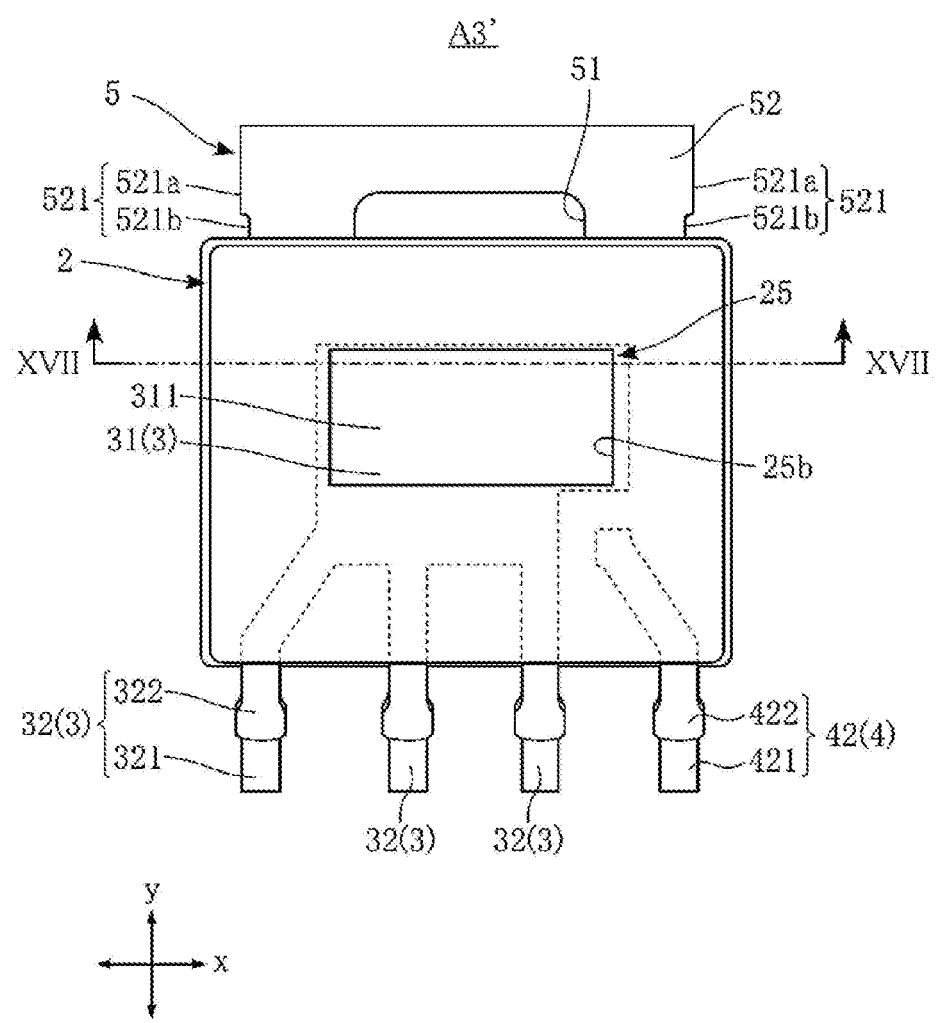
FIG. 16 is a plan view illustrating a semiconductor device according to a modification example of the third embodiment.
Figure 17:
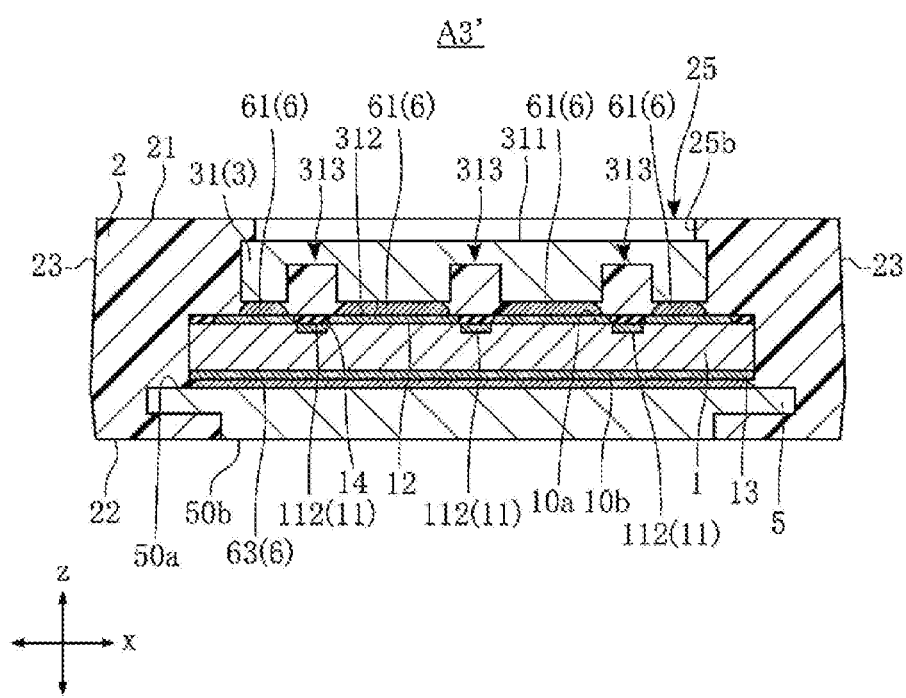
FIG. 17 is a cross-sectional view taken along line XVII-XVII in FIG. 16.

In the third embodiment, there has been described a case where the resin recess 25 includes the resin recess bottom surface 25a, but the resin recess 25 may not include such surface. FIGS. 16 and 17 illustrate a semiconductor device A3' according to such a modification example. FIG. 16 is a plan view illustrating the semiconductor device A3', and corresponds to FIG. 14. FIG. 17 is a cross-sectional view taken along line XVII-XVII in FIG. 16, and corresponds to FIG. 15.

In the semiconductor device A3', as illustrated in FIG. 17, one end edge of the resin recess side surface 25b of the resin recess 25 is connected to the resin main surface 21 and the other end edge thereof is in contact with the first pad main surface 311 in the z direction. Even in such a case, the same effects as those of the semiconductor device A3 can be obtained.

In the third embodiment and its modification example, there has been described a case where part of the first pad main surface 311 is exposed from the sealing resin 2 by the resin recess 25, but the present disclosure is not limited thereto. For example, at least part of the first pad main surface 311 may be exposed by reducing the thickness of the sealing resin 2 as a whole. In this case, the resin main surface 21 and the first pad main surface 311 are flush with each other. However, in this case, the second pad main surface 411 of the second lead 4 is similarly exposed from the sealing resin 2. Therefore, in order to prevent an unintended short-circuit between the first lead 3 and the second lead 4, measures may be taken as follows: the second pad main surface 411 is covered with an insulator, the second pad main surface 411 is located below the first pad main surface 311 in the z direction so that the second pad main surface 411 is not exposed from the sealing resin 2, and the like.

Figure 18:
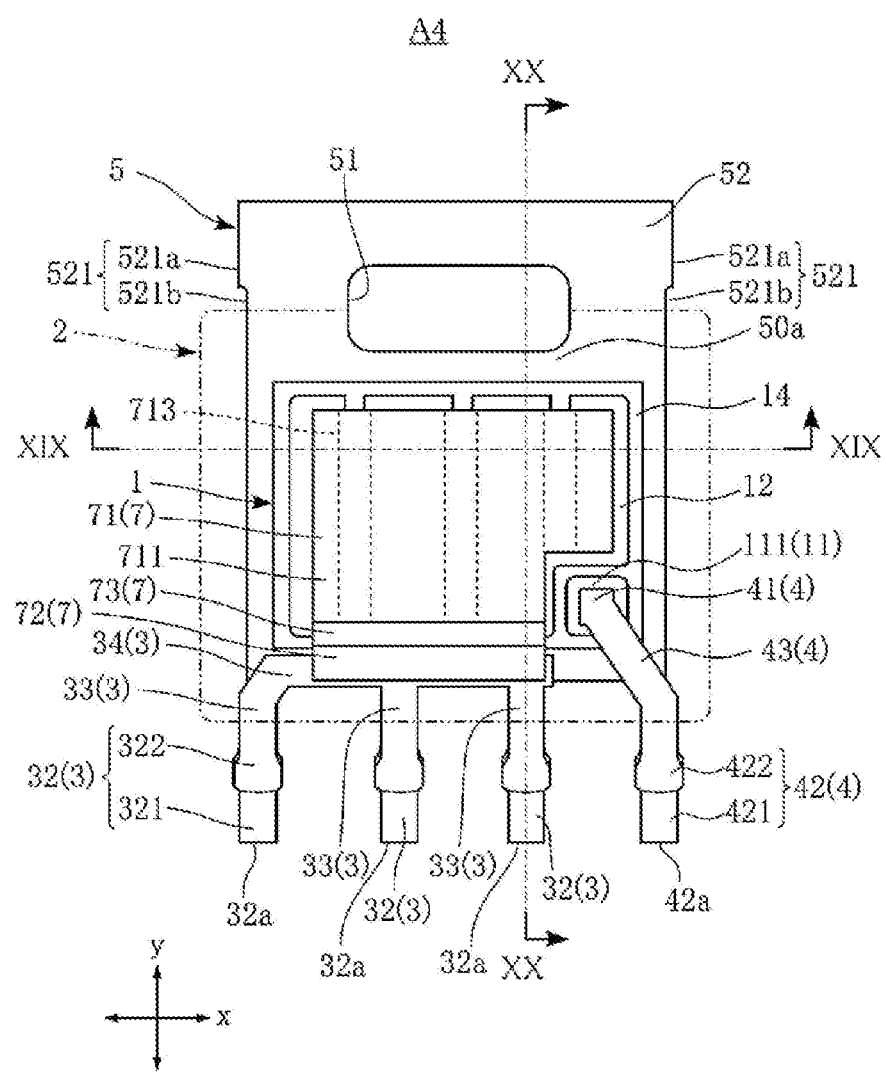
FIG. 18 is a plan view (in which a sealing resin is transmitted) illustrating a semiconductor device according to a fourth embodiment of the present disclosure.
Figure 19:
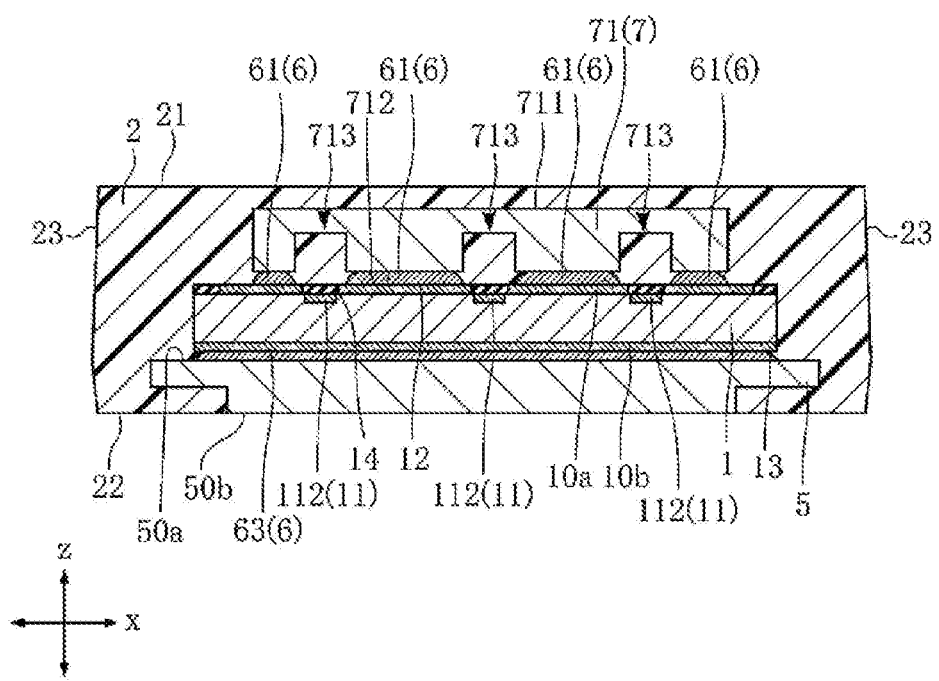
FIG. 19 is a cross-sectional view taken along line XIX-XIX in FIG. 18.
Figure 20:
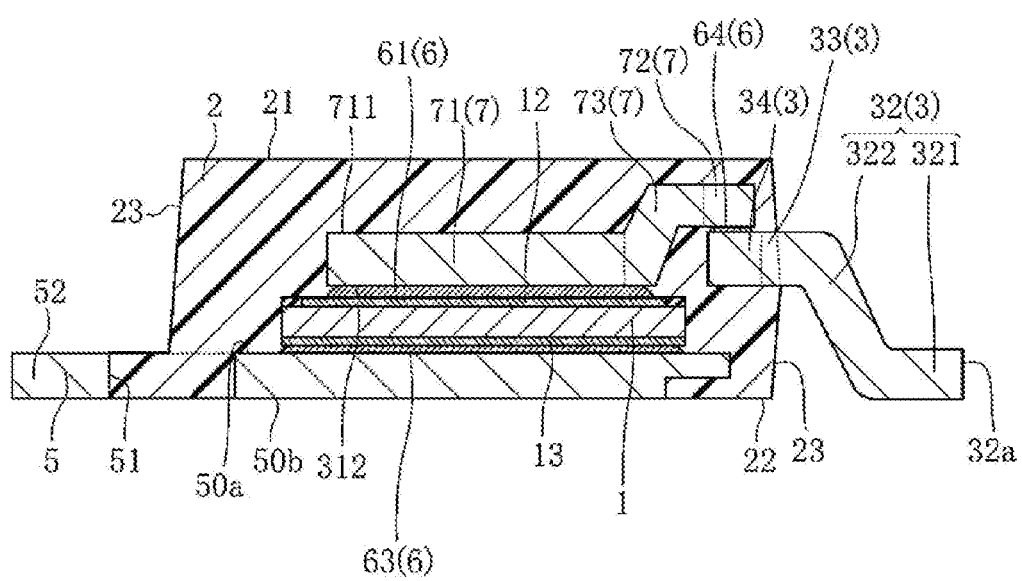
FIG. 20 is a cross-sectional view taken along line XX-XX in FIG. 18.

FIGS. 18 to 20 illustrate a semiconductor device according to a fourth embodiment of the present disclosure. A semiconductor device A4 of the present embodiment is different from the semiconductor device A1 (the first embodiment) in that the first lead 3 and the source electrode 12 of the semiconductor element 1 are electrically connected by means of a plate-shaped metal member 7 (hereinafter, referred to as a "strap member").

FIG. 18 is a plan view illustrating the semiconductor device A4. In FIG. 18, the sealing resin 2 is transmitted. FIG. 19 is a cross-sectional view taken along line XIX-XIX in FIG. 18. FIG. 19 corresponds to the cross section illustrated in FIG. 6 of the first embodiment. FIG. 20 is a cross-sectional view taken along line XX-XX in FIG. 18.

In the present embodiment, the first lead 3 includes a belt-shaped portion 34, a plurality of first exposure parts 32, and a plurality of first connection parts 33. The belt-shaped portion 34 is a portion to which the strap member 7 is bonded. In the present embodiment, the belt-shaped portion 34 has a rectangular shape extending in the x direction as viewed from the plane. In the present embodiment, each first connection part 33 is connected to the belt-shaped portion 34 and each first exposure part 32. Each first connection part 33 extends from an edge on one side (the lower side in FIG. 18) of the belt-shaped portion 34 in the y direction.

The strap member 7 is a plate-shaped metal member as described above. In the present embodiment, the strap member 7 is boned to each of the belt-shaped portion 34 of the first lead 3 and the source electrode 12 of the semiconductor element 1. The strap member 7 is entirely covered with the sealing resin 2. In the present embodiment, the strap member 7 corresponds to the "first conductive member"

described in the claims. The strap member 7 includes a first clip bond part 71, a second clip bond part 72, and a bent part 73.

The first clip bond part 71 is a part for bonding to the source electrode 12 of the semiconductor element 1. The first clip bond part 71 is configured similarly to the first pad part 31 of the first lead 3. In the present embodiment, the first clip bond part 71 corresponds to a "first pad part" described in the claims. The first clip bond part 71 includes a strap main surface 711, a strap bonding surface 712, and a plurality of recesses 713. The strap main surface 711, the strap bonding surface 712, and the plurality of recesses 713 are configured similarly to the first pad main surface 311, the first pad bonding surface 312, and the plurality of recesses 313 of the first pad part 31, respectively. In the present embodiment, the strap bonding surface 712 corresponds to the "bonding surface" described in the claims. The semiconductor element 1 is sandwiched between the first clip bond part 71 of the strap member 7 and the third lead 5.

The second clip bond part 72 is a part for bonding to the belt-shaped portion 34 of the first lead 3. The second clip bond part 72 is bonded to the belt-shaped portion 34 via a conductive binder 6 (fourth binder 64). The fourth binder 64 is made of, for example, solder or Ag paste. The material of the fourth binder 64 is not limited thereto.

The bent part 73 is connected to the first clip bond part 71 and the second clip bond part 72. In the present embodiment, the first clip bond part 71 and the second clip bond part 72 are arranged at different positions in the z direction. Therefore, the bent part 73 is bent in the z direction so as to connect them.

According to the semiconductor device A4, the first clip bond part 71 of the strap member 7 includes the plurality of recesses 713. With this configuration, a non-bonding portion that is not bonded to the source electrode 12 of the semiconductor element 1 is formed in the first clip bond part 71. Thus, it is possible to reduce a region where the semiconductor element 1 is constrained by the strap member 7 (the first clip bond part 71). This makes it possible to alleviate the stress applied to the semiconductor element 1 by a difference in thermal expansion coefficients of the strap member 7 and the semiconductor element 1. Therefore, since the semiconductor element 1 can be prevented from being damaged, the reliability of the semiconductor device A4 is improved. That is, the same effects as those of the first embodiment can be obtained. Furthermore, in the semiconductor device A4, the portion configured in the same manner as the semiconductor devices A1 to A3 can have the same effects as those of the semiconductor devices A1 to A3.

In the fourth embodiment, there has been described a case where the first lead 3 and the source electrode 12 are connected via the strap member 7, but the present disclosure is not limited thereto. For example, the second lead 4 and the gate electrode 11 may be connected by a strap member similar to the strap member 7.

In the third embodiment and the fourth embodiment, similar to the first embodiment, there has been described a case where the plurality of recesses 313 are formed in the first pad part 31, but similar to the second embodiment, a plurality of through holes 314 may be formed instead of the plurality of recesses 313.

In the first to fourth embodiments, the packages of the semiconductor devices A1 to A4 are not limited to those illustrated in the drawings. The semiconductor device according to the present disclosure may be any other surface-mounted package or pin-inserted package, or the like.

In the first to fourth embodiments, there has been described a case where the non-bonding portion (the recess 313 or the through hole 314) of the first pad part 31 overlaps with the finger electrode portion 112 of the gate electrode 11 as viewed from the plane, but the present disclosure is not limited thereto. In the semiconductor element 1, when there is a region which is not intended to be bonded by the first pad part 31, it may be configured so that the non-bonding portion overlaps with the region. An example of such a modification example will be described below with reference to FIG. 21.

Figure 21:
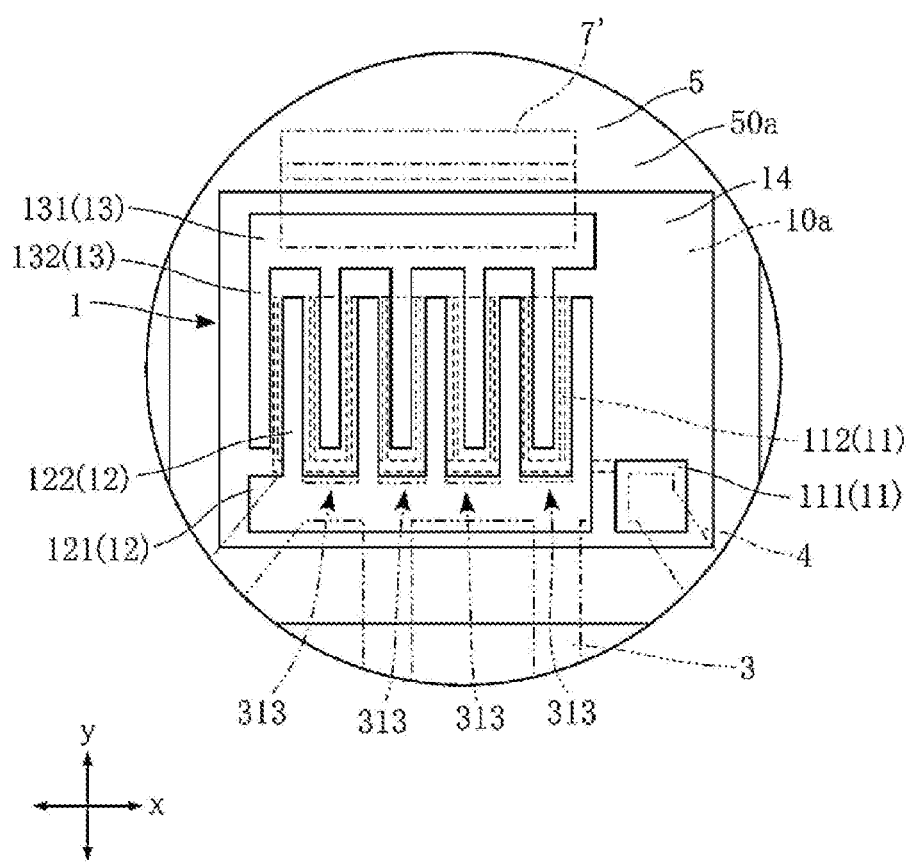
FIG. 21 is an enlarged plan view of a main part illustrating a semiconductor device according to a modification example.

FIG. 21 is an enlarged plan view of a main part according to the modification example, and corresponds to FIG. 3 in the first embodiment. In the semiconductor element 1 illustrated in FIG. 21, the gate electrode 11, the source electrode 12, and the drain electrode 13 are formed together on the element main surface 10a. Furthermore, in the element main surface 10a, the source electrode 12 and the drain electrode 13 are each formed in a comb shape.

The source electrode 12 includes a pad electrode portion 121 and a plurality of finger electrode portions 122. The pad electrode portion 121 has a rectangular shape extending in the x direction as viewed from the plane. The plurality of finger electrode portions 122 have a rectangular shape as viewed from the plane and extend in the y direction from an edge on one side (the upper side in FIG. 21) of the pad electrode portion 121 in the y direction. Both the pad electrode portion 121 and the plurality of finger electrode portions 122 are exposed from the passivation film 14.

The drain electrode 13 includes a pad electrode portion 131 and a plurality of finger electrode portions 132. The pad electrode portion 131 has a rectangular shape extending in the x direction as viewed from the plane. In the modification example, as illustrated in FIG. 21, the pad electrode portion 131 and the third lead 5 (loading surface 50a) are bonded by a strap member 7'. The present disclosure is not limited to the strap member 7' but it may be a bonding wire or a bonding ribbon. The plurality of finger electrode portions 132 are rectangular as viewed from the plane and extend in the y direction from an edge on one side (the lower side in FIG. 21) of the pad electrode portion 131 in the y direction. Both the pad electrode portion 131 and the plurality of finger electrode portions 132 are exposed from the passivation film 14.

The plurality of finger electrode portions 122 and the plurality of finger electrode portions 132 are alternately arranged in the x direction. In addition, the separation distances between adjacent finger electrode portions 122 and finger electrode portions 132 are all equal.

When the source electrode 12 thus configured is entirely bonded to the first pad part 31 having no non-bonding portion (for example, the plurality of recesses 313) as in the conventional art, it is also bonded to the drain electrode 13. As a result, the source electrode 12 and the drain electrode 13 are short-circuited. On the other hand, in the modification example illustrated in FIG. 21, a non-bonding portion (for example, the plurality of recesses 313) is formed in the first pad part 31, and the non-bonded portion overlaps with the finger electrode portion 132 of the drain electrode 13 as viewed from the plane. Therefore, it may be configured so that the first pad part 31 is bonded to the finger electrode portion 122 of the source electrode 12, and the first pad part 31 is not bonded to the finger electrode portion 132 of the drain electrode 13. Thus, it is possible to prevent a short circuit between the source electrode 12 and the drain electrode 13.

Furthermore, in the modification example illustrated in FIG. 21, the non-bonding portion (the plurality of recesses 313) of the first pad part 31 is not connected to an edge on one side (the lower side in FIG. 21) of the first pad part 31 in the y direction. Thus, the first pad part 31 can be bonded to substantially the entire surface of the pad electrode portion 121 of the source electrode 12. Therefore, since the first pad part 31 is bonded to substantially the entire surface of the pad electrode portion 121 of the source electrode 12 and the plurality of finger electrode portions 122, it is possible to reduce the internal resistance.

Furthermore, in the modification example illustrated in FIG. 21, the non-bonding portion (the plurality of recesses 313) of the first pad part 31 overlaps with the finger electrode portion 112 of the gate electrode 11 as viewed from the plane. Therefore, it is possible to suppress the semiconductor element 1 from being damaged due to a difference in thermal expansion coefficients of the passivation film 14 covering the finger electrode portion 112 of the gate electrode 11 and the first binder 61.

Moreover, in the aforementioned modification example, there has been described a case where, in the element main surface 10a of the semiconductor element 1, the drain electrode 13 is formed on the upper side as illustrated in FIG. 21 and the source electrode 12 is formed on the lower side as illustrated in FIG. 21, but they may be opposite. That is, the source electrode 12 is formed on the upper side as illustrated in FIG. 21, and the drain electrode 13 may be formed on the lower side as illustrated in FIG. 21. In this case, the first terminal part 321 of the first lead 3 becomes the drain terminal.

The semiconductor device according to the present disclosure is not limited to the aforementioned embodiments. The specific configuration of each part of the semiconductor device according to the present disclosure may be differently modified in design.

According to the present disclosure in some embodiments, it is possible to improve reliability of a semiconductor device.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A semiconductor device, comprising:
   a semiconductor element which includes an element main surface and an element rear surface that face opposite sides in a thickness direction and in which a first electrode and a second electrode are formed on the element main surface;
   a first conductive member electrically connected to the first electrode;
   a second conductive member electrically connected to the second electrode;
   a third conductive member on which the semiconductor element is mounted; and
   a sealing resin configured to cover part of the first conductive member, part of the second conductive member, and the semiconductor element, the sealing resin including a resin rear surface facing the same direction as the element rear surface,
   wherein the first conductive member comprises:
   a first pad part overlapping with the semiconductor element as viewed in the thickness direction;
   a first exposure part protruding from the sealing resin as viewed in the thickness direction; and
   a first connection part which is covered with the sealing resin and is connected to the first pad part and the first exposure part,
   wherein the first pad part comprises:
   a bonding surface bonded to the first electrode;
   a first pad main surface facing a direction opposite to the bonding surface in the thickness direction; and
   a non-bonding portion which includes an inner surface extending from the bonding surface toward the first pad main surface and is not bonded to the first electrode,
   wherein the first exposure part comprises:
   a first bent part which is connected to the first connection part and is bent in the thickness direction; and
   a first terminal part connected to the first bent part,
   wherein a third electrode is formed on the element rear surface of the semiconductor element,
   wherein the third conductive member is electrically connected to the third electrode, and includes a mounting surface facing the same direction as the element rear surface and exposed from the resin rear surface, and
   wherein the first terminal part is configured to overlap with the third conductive member as viewed in a first direction orthogonal to the thickness direction.

2. The device of claim 1, wherein the second electrode includes:
   a pad electrode portion to which the second conductive member is bonded; and
   a finger electrode portion for reducing an internal resistance of the second electrode, and
   wherein the non-bonding portion is configured to overlap with the finger electrode portion as viewed in the thickness direction.

3. The device of claim 2, wherein the semiconductor element includes an insulating film configured to cover the finger electrode portion.

4. The device of claim 2, wherein the semiconductor element is 0.05 to 0.3 mm square as viewed in the thickness direction.

5. The device of claim 1, wherein the second conductive member includes:
   a second pad part bonded to the second electrode;
   a second exposure part protruding from the sealing resin as viewed in the thickness direction; and
   a second connection part covered with the sealing resin and connected to the second pad part and the second exposure part.

6. The device of claim 5, wherein the second exposure part includes:
   a second bent part connected to the second connection part and bent in the thickness direction; and
   a second terminal part connected to the second bent part.

7. The device of claim 6, wherein the second terminal part is configured to overlap with the third conductive member as viewed in the first direction.

8. The device of claim 1, wherein the non-bonding portion further includes a bottom surface connected to the inner surface and facing the same direction as the bonding surface.

9. The device of claim 8, wherein the non-bonding portion includes a plurality of recesses, each of the plurality of recesses extending in the first direction orthogonal to the thickness direction and being arranged in a second direction orthogonal to both the thickness direction and the first direction.

10. The device of claim 9, wherein each of the plurality of recesses is connected from an edge on a first side of the first pad part in the first direction to an edge on a second side of the first pad part in the first direction.

11. The device of claim 1, wherein at least part of the first pad main surface is exposed from the sealing resin.

12. The device of claim 11, wherein the sealing resin includes:
- a resin main surface facing the same direction as the element main surface; and
- a resin recess recessed from the resin main surface, wherein the resin recess includes:
- a resin recess bottom surface; and
- a resin recess side surface connected to the resin recess bottom surface and the resin main surface, and
wherein the resin recess bottom surface and the first pad main surface are flush with each other.

13. The device of claim 1, wherein the semiconductor element is a power MOSFET,
wherein the first electrode is a source electrode, and
wherein the second electrode is a gate electrode.

* * * * *